(12) United States Patent
Oppata et al.

(10) Patent No.: US 11,275,305 B2
(45) Date of Patent: Mar. 15, 2022

(54) METHOD FOR PRODUCING PHOTOMASK, METHOD FOR PRODUCING SEMICONDUCTOR DEVICE, METHOD FOR FORMING PATTERN, AND PHOTOMASK

(71) Applicant: KIOXIA CORPORATION, Tokyo (JP)

(72) Inventors: Yukio Oppata, Chiba Chiba (JP); Kosuke Takai, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 57 days.

(21) Appl. No.: 16/804,826

(22) Filed: Feb. 28, 2020

(65) Prior Publication Data

US 2021/0048739 A1 Feb. 18, 2021

(30) Foreign Application Priority Data

Aug. 13, 2019 (JP) .............................. JP2019-148377

(51) Int. Cl.
| | |
|---|---|
| *G03F 1/76* | (2012.01) |
| *G03F 1/80* | (2012.01) |
| *G03F 1/78* | (2012.01) |
| *G03F 1/58* | (2012.01) |
| *G03F 1/48* | (2012.01) |
| *G03F 1/32* | (2012.01) |

(52) U.S. Cl.
CPC .................. *G03F 1/32* (2013.01); *G03F 1/48* (2013.01); *G03F 1/58* (2013.01); *G03F 1/76* (2013.01); *G03F 1/78* (2013.01); *G03F 1/80* (2013.01)

(58) Field of Classification Search
CPC ...... G03F 1/32; G03F 1/48; G03F 1/58; G03F 1/80; G03F 1/76; G03F 1/78
See application file for complete search history.

(56) References Cited

U.S. PATENT DOCUMENTS

| | | | | |
|---|---|---|---|---|
| 5,122,387 | A | * | 6/1992 | Takenaka ................ G03F 7/095 257/E21.025 |
| 5,955,222 | A | * | 9/1999 | Hibbs ....................... G03F 1/29 430/5 |
| 6,007,968 | A | * | 12/1999 | Furukawa ............... G03F 7/038 257/E21.027 |

(Continued)

FOREIGN PATENT DOCUMENTS

| | | | |
|---|---|---|---|
| JP | 06-250376 | * | 9/1994 |
| JP | 2010-048860 | * | 3/2010 |

(Continued)

OTHER PUBLICATIONS

Machine translation of JP 2016-173384 (2016).*

*Primary Examiner* — Martin J Angebranndt
(74) *Attorney, Agent, or Firm* — Kim & Stewart LLP

(57) ABSTRACT

A method for manufacturing a photomask includes obtaining a substrate on which a halftone film, a light-shielding film, and a resist film are stacked, irradiating a first region of the resist film at a first dose and a second region of the resist film that surrounds the first region at a second dose greater than the first dose, developing the resist film in the first region to form a mask pattern while leaving the resist film in the second region to form a mask frame pattern, and then patterning the light-shielding film using the mask pattern formed in the resist film.

14 Claims, 13 Drawing Sheets

(56) References Cited

U.S. PATENT DOCUMENTS

| | | | |
|---|---|---|---|
| 6,261,163 B1* | 7/2001 | Walker | B24B 21/04 |
| | | | 451/303 |
| 6,495,384 B1* | 12/2002 | Morimoto | H01S 5/12 |
| | | | 216/24 |
| 6,630,408 B1* | 10/2003 | Tzu | G03F 1/32 |
| | | | 430/5 |
| 9,158,192 B2 | 10/2015 | Fukaya et al. | |
| 9,939,723 B2 | 4/2018 | Shishido et al. | |
| 9,971,238 B2 | 5/2018 | Watanabe et al. | |
| 2007/0212618 A1* | 9/2007 | Yoshikawa | G03F 1/32 |
| | | | 430/5 |
| 2007/0212619 A1* | 9/2007 | Yoshikawa | G03F 1/30 |
| | | | 430/5 |
| 2008/0199786 A1* | 8/2008 | Jun | G03F 1/72 |
| | | | 430/5 |
| 2008/0241707 A1* | 10/2008 | Chen | G03F 1/32 |
| | | | 430/5 |
| 2016/0377974 A1* | 12/2016 | Chen | G03F 1/36 |
| | | | 430/5 |
| 2017/0153539 A1* | 6/2017 | Tu | G03F 1/80 |
| 2018/0164674 A1* | 6/2018 | Wistrom | G03F 1/76 |
| 2018/0259842 A1* | 9/2018 | Inazu | G03F 1/80 |
| 2018/0335691 A1* | 11/2018 | Nam | G03F 1/26 |
| 2018/0335692 A1* | 11/2018 | Nam | G03F 1/80 |
| 2019/0137862 A1* | 5/2019 | Yang | G03F 1/32 |
| 2019/0250500 A1* | 8/2019 | Jang | G03F 1/80 |

FOREIGN PATENT DOCUMENTS

| | | | |
|---|---|---|---|
| JP | 2010-072406 | * | 4/2010 |
| JP | 5686216 B1 | | 3/2015 |
| JP | 5739375 B2 | | 6/2015 |
| JP | 5779290 B1 | | 9/2015 |
| JP | 2016-173384 | * | 9/2016 |
| JP | 2017-058633 | * | 3/2017 |

* cited by examiner

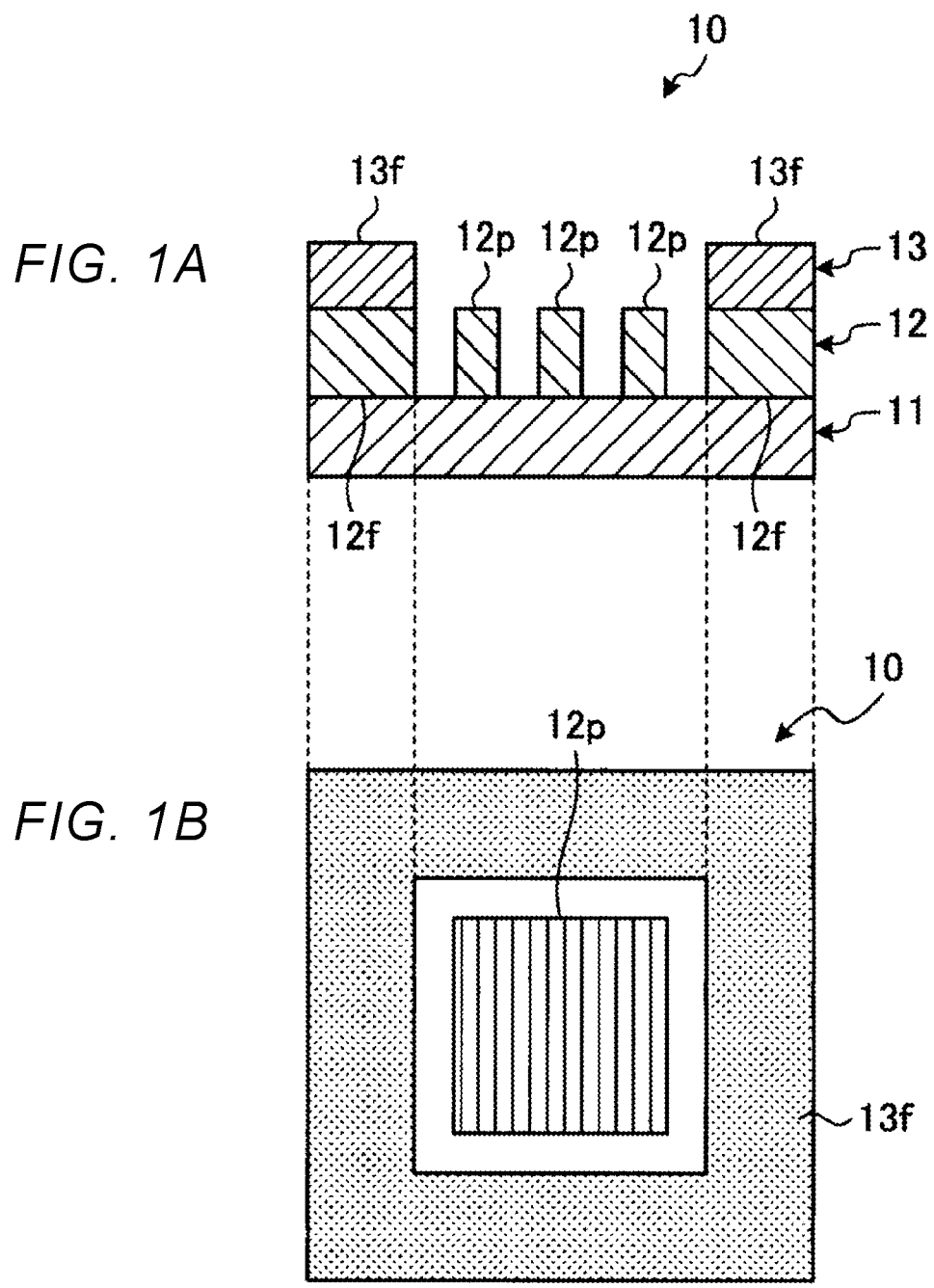

METHOD FOR PRODUCING PHOTOMASK, METHOD FOR PRODUCING SEMICONDUCTOR DEVICE, METHOD FOR FORMING PATTERN, AND PHOTOMASK

CROSS-REFERENCE TO RELATED APPLICATION(S)

This application is based upon and claims the benefit of priority from Japanese Patent Application No. 2019-148377, filed on Aug. 13, 2019, the entire contents of which are incorporated herein by reference.

FIELD

Embodiments described herein relate generally to a method for producing a photomask, a method for producing a semiconductor device, a method for forming a pattern, and a photomask.

BACKGROUND

A method for forming a fine-line pattern in a process of producing a semiconductor device includes a pattern transfer using a photomask (for example, a phase-shift mask) including a halftone film or the like. When such a photomask is produced, after a transfer pattern is formed in a halftone film, a light-shielding frame pattern surrounding the periphery of the pattern, for example, is formed with a light-shielding film. This requires multiple lithography steps to achieve.

DESCRIPTION OF THE DRAWINGS

FIGS. 1A and 1B are diagrams showing a configuration example of a photomask according to a first embodiment.

DETAILED DESCRIPTION

Figure 2A:
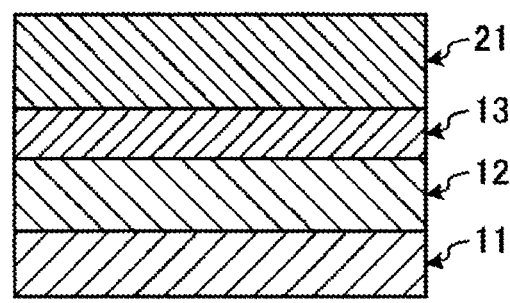
FIGS. 2A to 2F illustrate aspects of a method for producing the photomask according to the first embodiment.

Embodiments provide a method for producing a photomask, a method for producing a semiconductor device, a method for forming a pattern, and a photomask that forms a transfer pattern and a frame pattern by performing photolithography just one time.

In general, according to an embodiment, a method for manufacturing a photomask includes obtaining a substrate on which a halftone film, a light-shielding film, and a resist film are stacked, irradiating a first region of the resist film at a first dose and a second region of the resist film that surrounds the first region at a second dose, removing the first region to form a mask pattern while leaving the resist film in the second region to form a mask frame pattern, and etching the light-shielding film using the mask pattern and the mask frame pattern as etch mask.

Hereinafter, certain example embodiments will be described with reference to the drawings. It is to be noted that the following example embodiments are not intended as limitations on the present disclosure, but rather are presented for the purpose of explaining various technical concepts of the present disclosure. Moreover, particular elements and aspects described in conjunction with the following example embodiments will suggest various modifications and variations to a person of ordinary skill in the art and such modifications and variations are within the scope of the present disclosure.

First Embodiment

Hereinafter, a first embodiment will be described in detail with reference to the drawings.

(Configuration Example a Photomask)

FIGS. 1A and 1B are diagrams showing a configuration example of a photomask 10 according to the first embodiment. FIG. 1A is a sectional view of the photomask 10 and FIG. 1B is a plan view thereof.

As shown in FIGS. 1A and 1B, the photomask 10 of the first embodiment includes a substrate 11, a halftone film 12, and a light-shielding film 13.

The substrate 11 includes quartz or the like formed in the shape of a rectangle, for example. It is to be noted that the substrate 11 may include an element other than quartz as long as the element is a material transparent to the intended exposure light.

The halftone film 12 is placed on the substrate 11 and includes, for example, molybdenum silicon (MoSi) or the like. The halftone film 12 is a film whose exposure light transmittance is lower than that of quartz or the like of the substrate 11. The halftone film 12 is also called a phase-shift film and has the property of inverting the phase of transmitted light. The halftone film 12 includes a transfer pattern $12p$ as a first pattern and a frame pattern $12f$ as a second pattern.

The transfer pattern $12p$ is a pattern which is to be transferred to a resist film on a wafer, which will be described below. Since the transfer pattern $12p$ is formed by patterning the halftone film 12, the optical interference effect produced by the light that passed through the substrate 11 and the light whose phase was shifted by the passage through the transfer pattern $12p$ can improve the resolution of a pattern. The frame pattern $12f$ serves as a base of a frame pattern $13f$, which will be described below.

The light-shielding film 13 is placed on the halftone film 12 and comprises, for example, Cr, Ta, an oxide of Cr or Ta, or the like. The light-shielding film 13 is intended to substantially completely block the exposure light. That is, the light-shielding film 13 does not allow exposure light to pass therethrough. The light-shielding film 13 includes the frame pattern $13f$.

The frame pattern $13f$ is a pattern that is placed around the outside of the transfer pattern $12p$ and surrounds the transfer pattern $12p$ as a frame. With the frame pattern $13f$, even when adjacent shot (exposure) regions or the like are being exposed on the wafer, it is possible to prevent overlapping exposures from occurring between the adjacent shot regions which are exposed to light at different times during the wafer exposure process.

To prevent overlapping exposure, a movable light-shielding shutter is also typically provided to the side of the exposure machine used to expose the wafer to light. When the wafer is being exposed to light in different locations, the light is blocked from reaching beyond the outer periphery of the intended shot region by moving or adjusting the light-shielding shutter in accordance with the size and position of the shot region of the wafer. The frame pattern 13f may serve to assist the light-shielding shutter achieving such a result.

(Method for Producing a Photomask)

Next, an example of a method for producing the photomask 10 of the first embodiment will be described using FIGS. 2A to 2F. FIGS. 2A to 2F illustrate a flow of the method for producing the photomask 10 according to the first embodiment.

As shown in FIG. 2A, on the substrate 11, such as quartz, the halftone film 12, the light-shielding film 13, and a resist film 21 are formed in this order from the substrate 11 surface.

Figure 2B:
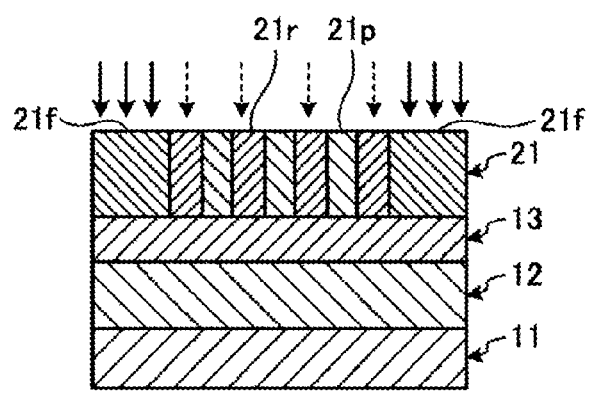

As shown in FIG. 2B, part of the resist film 21 is then irradiated and patterned with, for example, an electron beam. As a result, a pattern-to-be-removed 21r portion, which corresponds in this example to the irradiated portions of the resist film 21, and a transfer pattern 21p portion, which has not been irradiated and will have a pattern substantially matching the transfer pattern 12p to be formed by patterning the halftone film 12. The portions 21r and 21p are formed in a central region of the resist film 21. Furthermore, a frame pattern 21f portion is also irradiated and is formed so as a frame to surround the outer periphery of the pattern-to-be-removed 21r and the transfer pattern 21p.

In this case, the irradiation dose with which the pattern-to-be-removed 21r is written is different from the irradiation dose with which the frame pattern 21f is exposed. The exposure dose (energy/unit area) with which the pattern-to-be-removed 21r is irradiated may be made different from the exposure dose with which the frame pattern 21f is irradiated by changing one or both of an irradiation time or the intensity of irradiation, for instance. For example, the pattern-to-be-removed 21r is irradiated for an irradiation time or at the intensity, which is typically used for exposing the resist film 21 is to light for patterning. The frame pattern 21f is irradiated with an exposure dose that is increased by increasing the irradiation time or the irradiation intensity.

As described above, it can be considered that the resist film 21 has a first region including the pattern-to-be-removed 21r and the transfer pattern 21p and a second region which surrounds the first region and includes the frame pattern 21f. At least part of the first region is irradiated at a first exposure dose and the second region is irradiated at a second exposure dose that is different from the first exposure dose.

Figure 2C:
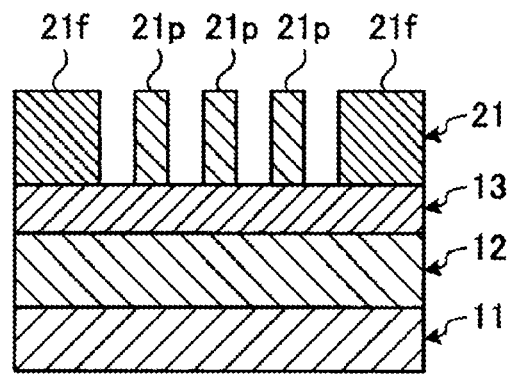

As shown in FIG. 2C, by supplying a developer to the resist film 21 in which the transfer pattern 21p, the pattern-to-be-removed 21r, and the frame pattern 21f has been formed, part of the resist film 21 is dissolved and removed.

The developer in this example dissolves and removes the portions of the resist film 21 that were exposed to light, that is the portion of the resist film 21 that was patterned/written with electron beam exposure or the like at the first exposure dose. However, when the irradiation dose exceeds some threshold dose level, then such an irradiated portion will be cured (e.g., cross-linked) and such an highly exposed portion cannot be readily dissolved by the developer. Thus, the pattern-to-be-removed 21r is dissolved and removed but the substantially unexposed transfer pattern 21p portion remains. But the frame pattern 21f, which is irradiated in this example to above the threshold dose level, also remains after development since it has been cured by the second exposure dose.

As a result, the resist film 21 has the transfer pattern 21p and the frame pattern 21f which were left without being removed by developer.

Figure 2D:
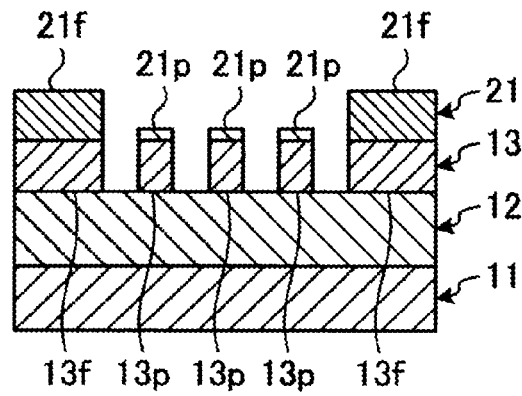

As shown in FIG. 2D, by using the remaining portions of the resist film 21 as a mask, the light-shielding film 13 can be processed by etching using plasma or the like. As a result, a transfer pattern 13p to which the transfer pattern 21p of the resist film 21 was transferred and a frame pattern 13f to which the frame pattern 21f was transferred are formed in the light-shielding film 13.

Here, as the light-shielding film 13 is etched, the resist film 21 serving as the mask is also etched to a certain extent. In this example, the transfer pattern 21p and the frame pattern 21f differ in etching tolerance (etch resistance) since the frame pattern 21f has been cured by a high exposure dose.

As mentioned earlier, the frame pattern 21f is formed by patterning the resist film 21. The frame pattern 21f is irradiated with a high exposure dose and is thereby cured in the exposure process, and the etching tolerance of the cured frame pattern 21f will generally higher than the etching tolerance of the uncured (substantially unexposed) transfer pattern 21p. Therefore, when the light-shielding film 13 is removed by etching until the halftone film 12 under the light-shielding film 13 is exposed, the film thickness of the transfer pattern 21p is less than the film thickness of the frame pattern 21f.

Figure 2E:
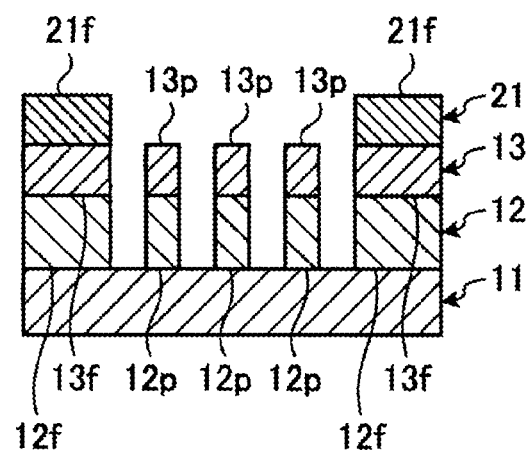

As shown in FIG. 2E, by using the remaining resist film 21 as a mask, the halftone film 12 is then processed by etching using plasma or the like. As a result, the transfer pattern 12p (to which the transfer pattern 21p of the resist film 21 was transferred) and the frame pattern 12f (to which the frame pattern 21f was transferred) are formed in the halftone film 12.

Moreover, as mentioned earlier, since the etching tolerance of the transfer pattern 21p is low and the film thickness thereof is reduced, when the halftone film 12 is removed by etching until the substrate 11 under the halftone film 12 is exposed, the transfer pattern 21p disappears.

It is to be noted that the transfer pattern 21p may disappear while the halftone film 12 is etched. Since conditions under which the light-shielding film 13 is less likely to be etched are used in processing of the halftone film 12, the transfer pattern 12p of the halftone film 12 is formed using the transfer pattern 13p of the light-shielding film 13 as a mask after the disappearance of the transfer pattern 21p.

Figure 2F:
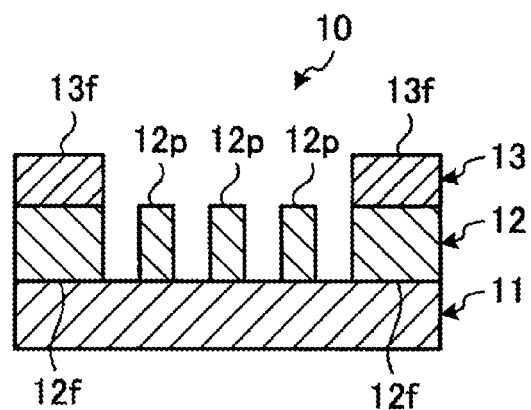

As shown in FIG. 2F, by using the resist film 21 as a mask, the light-shielding film 13 is further processed by etching using plasma or the like. As a result, of the light-shielding film 13, the frame pattern 13f protected by the frame pattern 21f is left and the transfer pattern 13p is removed by etching. When the transfer pattern 13p of the light-shielding film 13 is removed by etching until the transfer pattern 12p under the transfer pattern 13p is exposed, the frame pattern 21f of the resist film 21 disappears.

In this way, the photomask 10 of the first embodiment is produced.

(Method for Producing a Semiconductor Device)

Next, an example of a method for forming a pattern using the photomask 10 of the first embodiment will be described using FIGS. 3A to 3C and FIGS. 4A and 4B. FIGS. 3A to 3C and FIGS. 4A and 4B illustrate a flow of a method for producing a semiconductor device according to the first embodiment. The method for forming a pattern using the photomask 10 can be performed as part of a method for producing a semiconductor device.

Figure 3A:
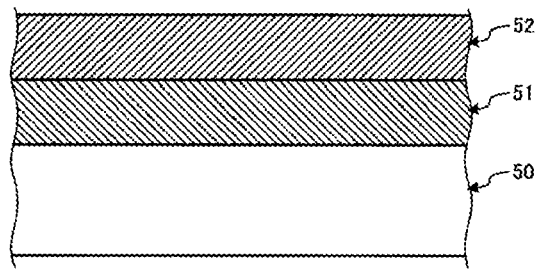
FIGS. 3A to 3C illustrate aspects of a method for producing a semiconductor device according to the first embodiment.

As shown in FIG. 3A, on a wafer 50 as a semiconductor substrate, a film-to-be-processed 51 and a resist film 52 as a mask film, are formed in this order on the substrate.

Figure 3B:
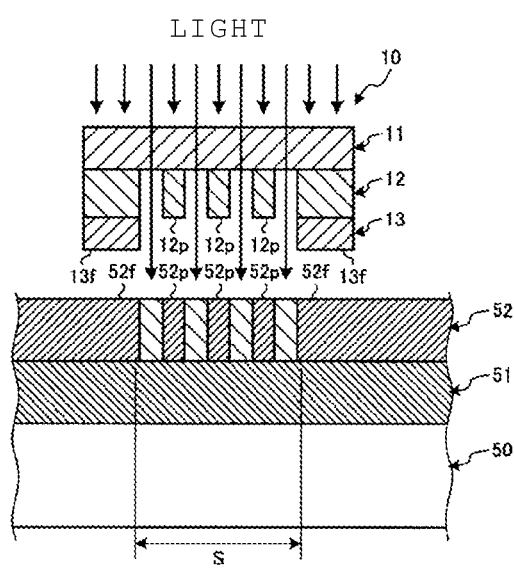

As shown in FIG. 3B, the photomask 10 is placed above the resist film 52 of the wafer 50. In this case, the side where the transfer pattern 12p, the frame pattern 13f, and so forth are formed is made to face the wafer 50.

Light of a predetermined wavelength transmitted through the photomask 10 from above so that the resist film 52 on the wafer 50 is exposed to the light in a manner corresponding to the pattern of the photomask 10. The exposure dose in this case is assumed to be a normal exposure dose at which the resist film 52 is responsive (patternable).

As a result, the resist film 52 is exposed to light corresponding to the photomask 10 pattern of light and dark (or the like) regions (light regions correspond to the regions of substrate 11 uncovered by transfer pattern 12p or frame pattern 13f; dark regions correspond to the regions of the substrate 11 covered by the transfer pattern 12p or the frame pattern 13f). Then, in the resist film 52 in locations facing the transfer pattern 12p or the frame pattern 13f, a resist pattern 52p corresponding to transfer pattern 12p and a frame pattern 52f corresponding to the frame pattern 13f are formed.

It is to be noted that a shot region S on the substrate 11 includes the region in which at least the resist pattern 52p is formed. In this example, the shot region S does not include a region in which the frame pattern 52f is formed. Alternatively, even when the shot region S includes a region in which the frame pattern 52f is formed, the frame pattern 52f is placed in a location that does not affect the intended pattern to be formed within the shot region S.

Figure 3C:
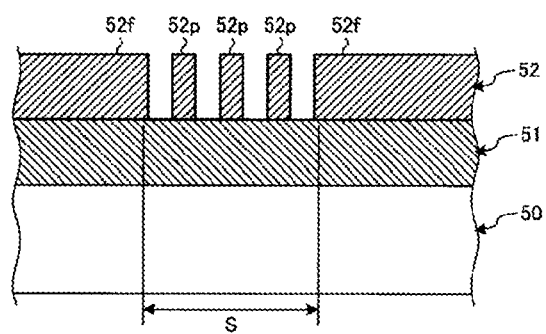

As shown in FIG. 3C, the resist film 52 in a portion exposed to light is removed by using a developer.

Figure 4A:
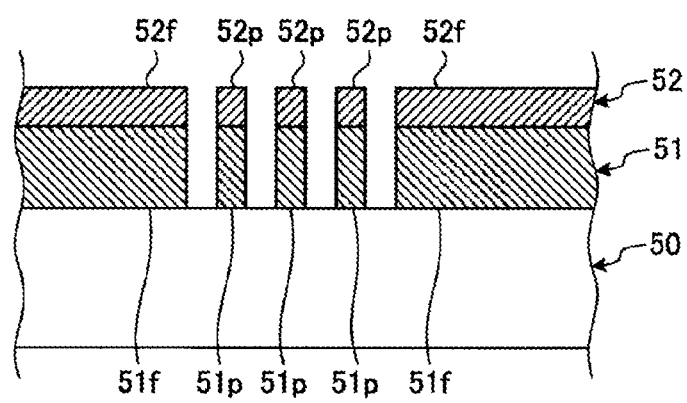
FIGS. 4A and 4B illustrate aspects of the method for producing the semiconductor device according to the first embodiment.

As shown in FIG. 4A, by using now patterned resist film 52 having the resist pattern 52p and the frame pattern 52f formed therein as a mask, the film-to-be-processed 51 is etched. As a result, the film-to-be-processed 51 having a pattern 51p and a frame pattern 51f is obtained.

Figure 4B:
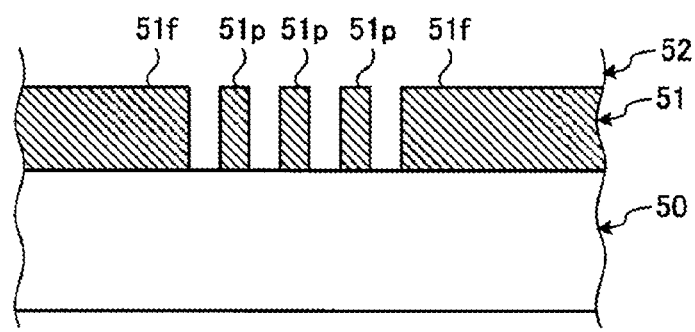

As shown in FIG. 4B, the resist film 52 which is left is then removed.

Then, by repeating the processes shown in FIGS. 3A to 3C and FIGS. 4A and 4B a predetermined number of times, a semiconductor device can be produced.

Comparative Example

Figure 5A:
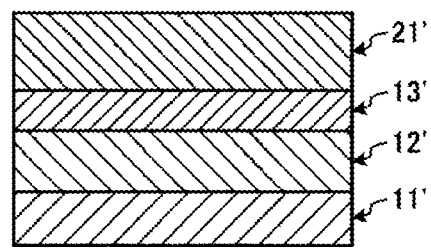
FIGS. 5A to 5G illustrate aspects of a method for producing a photomask according to a first comparative example.
Figure 5B:
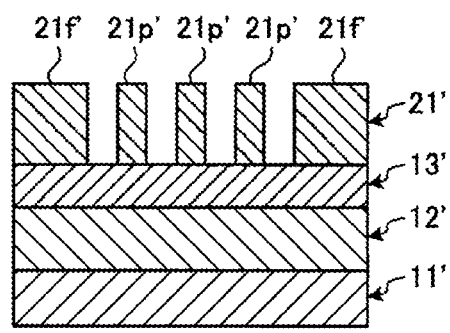
Figure 5C:
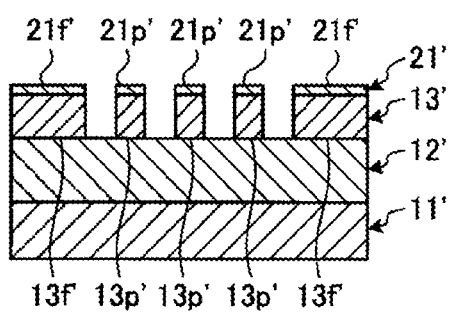
Figure 5D:
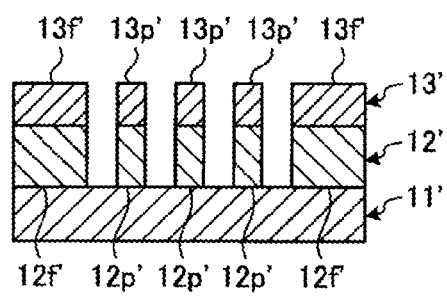
Figure 5E:
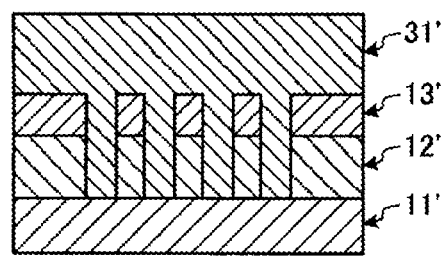

Next, a method for producing a photomask 10' of a comparative example will be described using FIGS. 5A to 5G. On a substrate 11', a halftone film 12', a light-shielding film 13', and a resist film 21' are formed (FIG. 5A), and a transfer pattern 21p' and a frame pattern 21f' are formed by exposing the resist film 21' to light by irradiating the resist film 21' with electron beams or the like with a normal irradiation dose (FIG. 5B). By etching the light-shielding film 13' using the resist film 21' as a mask, a transfer pattern 13p' and a frame pattern 13f' are formed (FIG. 5C). In this case, the transfer pattern 21p' and the frame pattern 21f' are etched at nearly equal rates and have nearly equal film thicknesses. By then etching the halftone film 12' using the resist film 21' as a mask, a transfer pattern 12p' and a frame pattern 12f' are formed (FIG. 5D). The resist film 21' disappears or is removed.

Figure 5F:
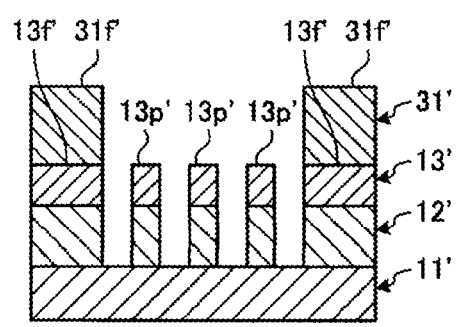
Figure 5G:
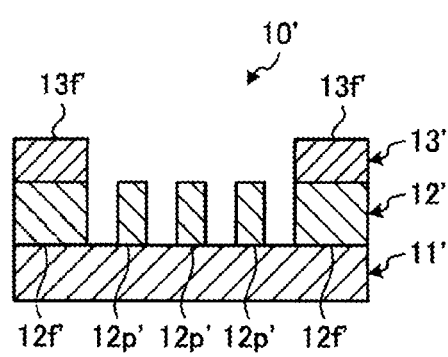

A resist film 31' is formed so as to cover the halftone film 12' and the light-shielding film 13' (FIG. 5E), and a frame pattern 31f' is formed by exposing the resist film 31' to light by irradiating the resist film 31' with electron beams or the like with a normal irradiation dose (FIG. 5F). By removing the transfer pattern 13p' of the light-shielding film 13' by etching using the resist film 31' as a mask, the light-shielding film 13' having the frame pattern 13f' is formed (FIG. 5G).

As described above, with the method for producing the photomask 10' of the comparative example, it is necessary to perform photolithography multiple times using the resist films 21' and 31' in order to form the frame pattern 13f' of the light-shielding film 13'. This lengthens the period of production of the photomask 10'. Moreover, since the resist film 31' is formed even in spaces between the transfer patterns 12p' and between the transfer patterns 13p', the resist film 31' sometimes remains as foreign matter in the subsequent process.

With the method for producing the photomask 10 of the first embodiment, it is possible to produce the photomask 10 by performing photolithography one time using the resist film 21. This makes it possible to shorten the period of production of the photomask 10 and prevent foreign matter from remaining.

In the method for producing the photomask 10 of the first embodiment, by irradiating a certain region of the resist film 21 at a first exposure dose then and irradiating a different region of the resist film 21 a second exposure dose different from the first exposure dose, the transfer pattern 21p and the frame pattern 21f having different etch resistances can be formed. This makes it possible to form the transfer pattern 12p of the halftone film 12 and the frame pattern 13f of the light-shielding film 13 by performing photolithography just one time.

In the above-described first embodiment, the irradiation dose of the transfer pattern 21p is different from the irradiation dose of the frame pattern 21f, but the embodiment is not limited thereto. For example, the irradiation dose for the transfer pattern 21p may be equal to the irradiation dose for the frame pattern 21f during the beam writing process or the like, and then the frame pattern 21f may be irradiated with, for example, additional ultraviolet light exposure. By a UV-curing effect produced by irradiation with the ultraviolet light, a frame pattern 21f which does not dissolve in the developer and has etching tolerance higher than the etching tolerance of the transfer pattern 21p can be obtained.

Second Embodiment

The second embodiment differs from the first embodiment in that in a photomask of the second embodiment the frame pattern has a multilayer structure.

(Configuration Examples of Photomasks)

Figure 6A:
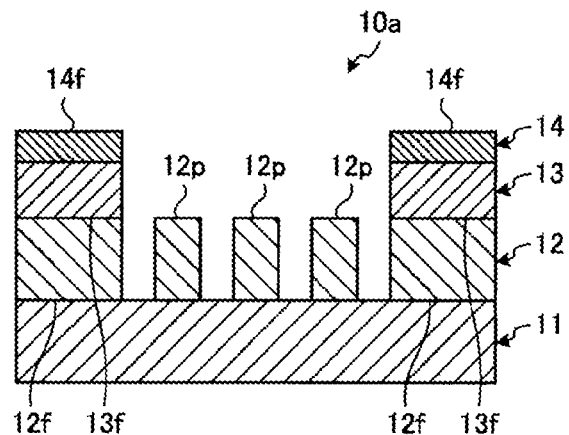
FIGS. 6A to 6C are diagrams showing configuration examples of photomasks according to a second embodiment.
Figure 6B:
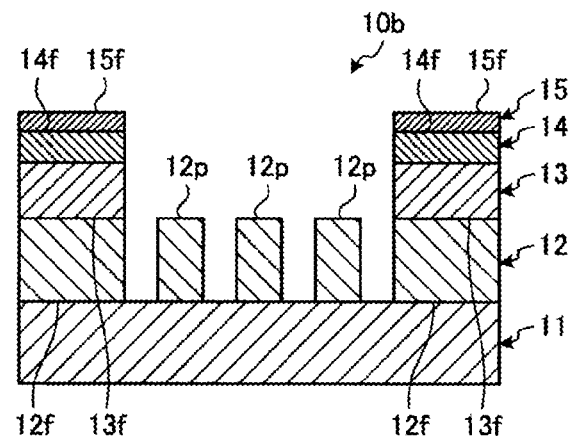
Figure 6C:
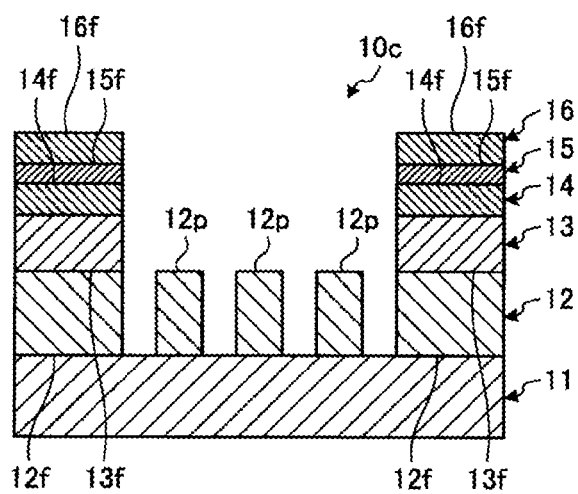

FIGS. 6A to 6C are diagrams showing configuration examples of photomasks 10a to 10c according to the second embodiment.

As shown in FIG. 6A, in addition to the configuration of the photomask 10 of the above-described first embodiment, the photomask 10a includes a hard mask film 14 which is placed on the light-shielding film 13. The hard mask film 14 includes, for example, $SiO_2$, SiN, a $SiO_2$/SiN composite, or the like.

The hard mask film 14 includes a frame pattern 14f which is placed on the frame pattern 13f of the light-shielding film 13. As described above, the photomask 10a includes the frame patterns 13f and 14f with a multilayer structure consisting of the light-shielding film 13 and the hard mask film 14.

As shown in FIG. 6B, in addition to the configuration of the above-described photomask 10a, the photomask 10b includes a light-shielding film 15 which is placed on the hard mask film 14. The light-shielding film 15 may include, for example, a material similar to the material for the above-described light-shielding film 13. The material for the light-shielding film 15 may be different from the material for the light-shielding film 13.

The light-shielding film 15 includes a frame pattern 15f which is placed on the frame pattern 14f of the hard mask film 14. As described above, the photomask 10b includes the frame patterns 13f, 14f, and 15f with a multilayer structure consisting of the light-shielding film 13, the hard mask film 14, and the light-shielding film 15.

As shown in FIG. 6C, in addition to the configuration of the above-described photomask 10b, the photomask 10c includes a hard mask film 16 which is placed on the light-shielding film 15. The hard mask film 16 may include, for example, a material similar to the material for the above-described hard mask film 14. The material for the hard mask film 16 may be different from the material for the hard mask film 14.

The hard mask film 16 includes a frame pattern 16f which is placed on the frame pattern 15f of the light-shielding film 15. As described above, the photomask 10c includes the frame patterns 13f, 14f, 15f, and 16f with a multilayer structure consisting of the light-shielding film 13, the hard mask film 14, the light-shielding film 15, and the hard mask film 16.

(Method for Producing a Photomask)

The photomasks 10a to 10c of the second embodiment are produced by initially changing appropriately a film configuration which is stacked on the substrate 11. Hereinafter, as a representative example, an example of a method for producing the photomask 10a of the second embodiment will be described using FIGS. 7A to 7G. FIGS. 7A to 7G illustrate a flow of the method for producing the photomask 10a according to the second embodiment.

Figure 7A:
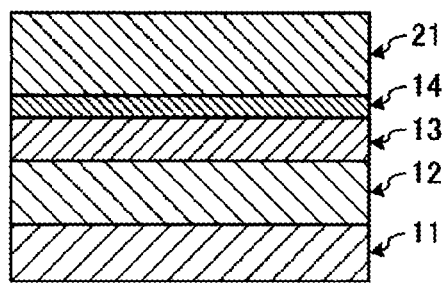
FIGS. 7A to 7G illustrate aspects of a method for producing the photomask according to the second embodiment.

As shown in FIG. 7A, on the substrate 11, the halftone film 12, the light-shielding film 13, the hard mask film 14, and the resist film 21 as a mask film are formed in this order.

Figure 7B:
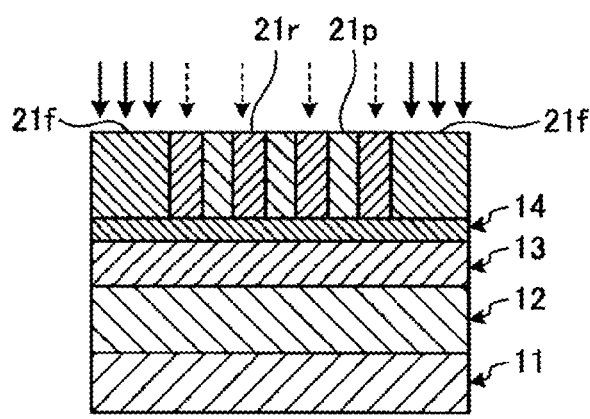

As shown in FIG. 7B, part of the resist film 21 is written/exposed using, for example, electron beams> The first region of the resist film 21 is irradiated at a first exposure dose and the second region of the resist film 21 is irradiated with a second exposure dose that is different from the first exposure dose. As a result, the transfer pattern 21p portion (which corresponds to the portion of the resist film 21 which has not been substantially irradiated), the pattern-to-be-removed 21r portion (which corresponds to the portion of the resist film 21 which has been irradiated at the first exposure dose level), and the frame pattern 21f portion (which corresponds to the portion of resist film 21 that has been irradiated at the second exposure dose level, which in this example is higher than the first exposure dose level) are formed.

Figure 7C:
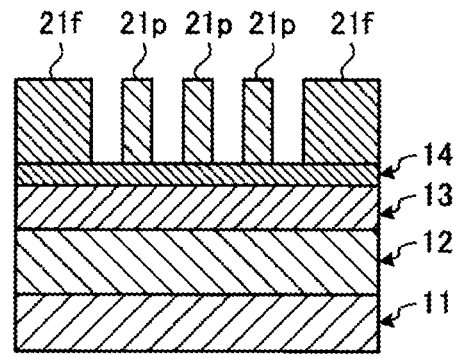

As shown in FIG. 7C, the pattern-to-be-removed 21r is removed by supplying a developer to the resist film 21.

Figure 7D:
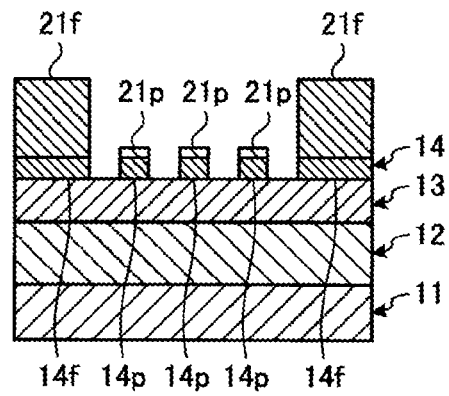

As shown in FIG. 7D, by using the remaining portions of the resist film 21 as a mask, the hard mask film 14 can be etched using plasma or the like. As a result, the hard mask film 14 has a transfer pattern 14p and the frame pattern 14f formed therein or therefrom. The remaining film thickness of the transfer pattern 21p portion will generally be smaller than the remaining film thickness of the frame pattern 21f portion.

Figure 7E:
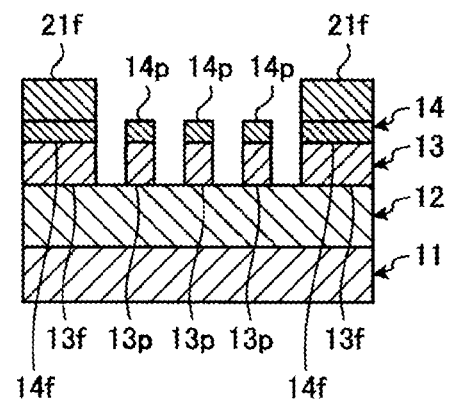

As shown in FIG. 7E, by using the remaining portions of the resist film 21 as a mask, the light-shielding film 13 can be then etched. As a result, the light-shielding film 13 has the transfer pattern 13p and the frame pattern 13f formed therein or therefrom. The transfer pattern 21p of the resist film 21 generally disappears in the etching process.

Figure 7F:
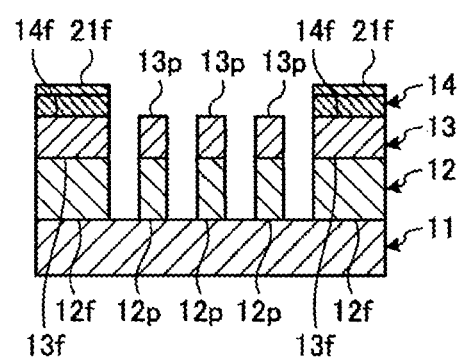

As shown in FIG. 7F, by using the transfer pattern 14p of the hard mask film 14 and the frame pattern 21f of the resist film 21 as a mask, the halftone film 12 is etched. As a result, the halftone film 12 having the transfer pattern 12p and the frame pattern 12f is formed. By processing the halftone film 12 using the hard mask film 14 as a mask, the transfer pattern 12p having a good critical dimension (CD) is obtained. The transfer pattern 14p of the hard mask film 14 disappears.

Figure 7G:
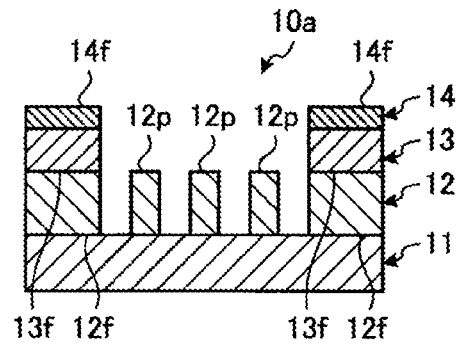

As shown in FIG. 7G, by using the frame pattern 21f of the resist film 21 as a mask, the transfer pattern 13p of the light-shielding film 13 is removed by etching. The frame pattern 21f disappears.

In this way, the photomask 10a of the second embodiment is produced.

Comparative Example

Figure 8A:
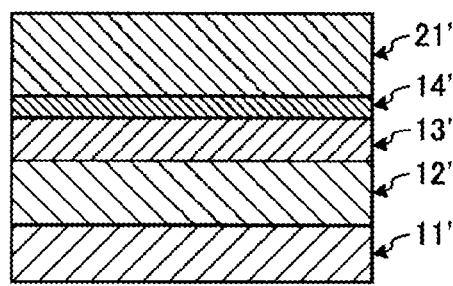
FIGS. 8A to 8H illustrate aspects of a method for producing a photomask according to a second comparative example.
Figure 8B:
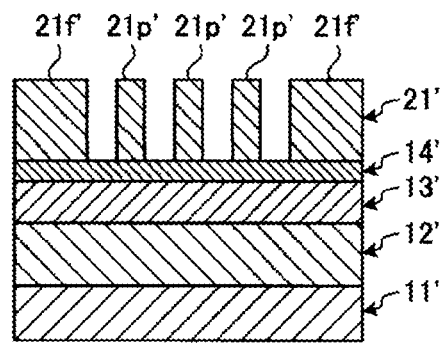
Figure 8C:
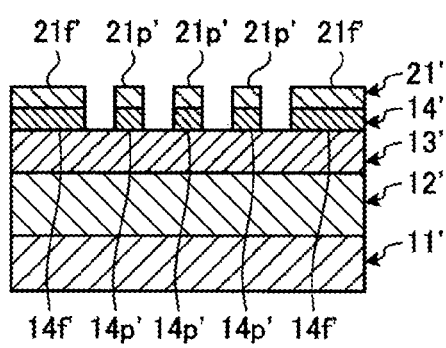
Figure 8D:
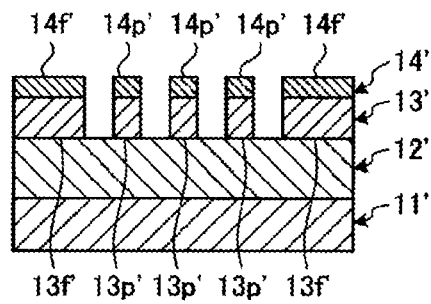
Figure 8E:
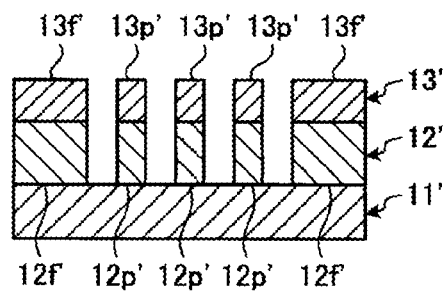
Figure 8F:
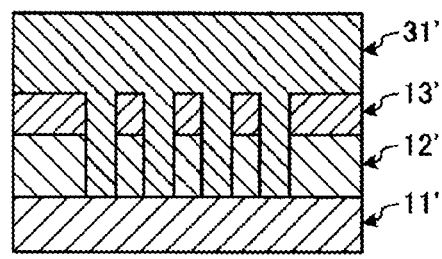

Next, a method for producing a photomask 10a' of a comparative example will be described using FIGS. 8A to 8H. On a substrate 11', a halftone film 12', a light-shielding film 13', a hard mask film 14', and a resist film 21' are formed (FIG. 8A), and a transfer pattern 21p' and a frame pattern 21f' are formed by exposing the resist film 21' to light by irradiating the resist film 21' with electron beams or the like at a standard patterning irradiation dose (FIG. 8B). The hard mask film 14' is etched using the resist film 21' as a mask (FIG. 8C), and, by then etching the light-shielding film 13' (FIG. 8D), transfer patterns 13p' and 14p' and frame patterns 13f' and 14f' are formed. The resist film 21' disappears. By etching the halftone film 12' using the hard mask film 14' as a mask, a transfer pattern 12p' and a frame pattern 12f' are formed (FIG. 8E). The hard mask film 14' disappears. If the hard mask film 14' is left, the hard mask film 14' may be removed separately.

Figure 8G:
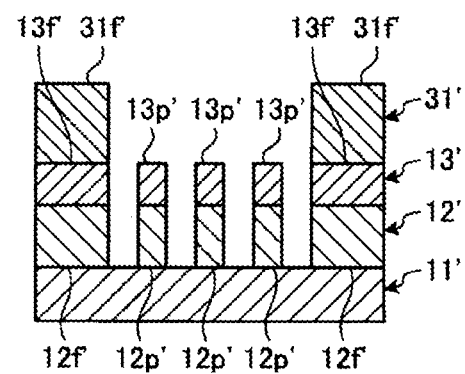
Figure 8H:
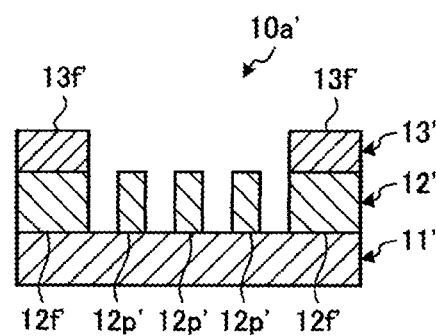

A resist film 31' is formed so as to cover the halftone film 12' and the light-shielding film 13' (FIG. 8F), and a frame pattern 31f' is formed by exposing the resist film 31' to light by irradiating the resist film 31' with electron beams or the like with a standard patterning irradiation dose (FIG. 8G). By removing the transfer pattern 13p' of the light-shielding film 13' by etching using the resist film 31' as a mask, the light-shielding film 13' having the frame pattern 13f' is formed (FIG. 8H).

As described above, with the method for producing the photomask 10a' of the comparative example, it is still necessary to perform photolithography multiple times using the resist films 21' and 31' in order to form the frame pattern 13f' of the light-shielding film 13'.

The method for producing the photomasks 10a to 10c of the second embodiment produces effects similar to the effects of the above-described first embodiment.

With the method for producing the photomasks 10a to 10c of the second embodiment, by processing the halftone film 12 using the hard mask films 14 and 16 and so forth as a mask, it is possible to form the transfer pattern 12p with a good CD.

With the method for producing the photomask 10b of the second embodiment, by placing the light-shielding film 15 including Cr or the like on the hard mask film 14 while improving the CD of the transfer pattern 12p by the hard mask film 14, it is possible to increase the adhesion between the light-shielding film 15 and the resist film 21 compared to the adhesion between the hard mask film 14 and the resist film 21.

With the photomasks 10a to 10c of the second embodiment, since the frame patterns 13f to 16f have a multilayer structure, it is possible to block light from reaching the outer periphery of a shot region more effectively. Moreover, it is also possible to increase flexibility in design, such as reducing the thickness of the light-shielding film 13.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a photomask comprising:
   obtaining a substrate on which a halftone film, a light-shielding film, and a resist film are stacked;
   irradiating a part of a first region of the resist film at a first dose and a second region of the resist film that surrounds the first region at a second dose greater than the first dose;
   removing the irradiated part of the first region of the resist film while leaving a non-irradiated part of the first region of the resist film to form a mask pattern and while leaving the irradiated second region of the resist film to form a mask frame pattern; and
   etching the light-shielding film using the mask pattern and the mask frame pattern as an etch mask.

2. The method according to claim 1, further comprising:
   etching the halftone film using the etched light-shielding film and at least the mask frame pattern as an etch mask.

3. The method according to claim 2, further comprising:
   removing a portion of the light-shielding film remaining on the patterned halftone film within a region surrounded by the mask frame pattern.

4. The method according to claim 1, wherein the part of the first region and the second region of the resist film are exposed by an electron beam.

5. The method according to claim 1, wherein said irradiating comprises:
   irradiating the part of the first region of the resist film with energy radiation of a predetermined intensity for a first period of time; and
   irradiating the second region of the resist film with energy radiation of the predetermined intensity for a second period of time that is greater than the first period of time.

6. The method according to claim 1, wherein said irradiating comprises:
   irradiating the part of the first region of the resist film with energy radiation of a first intensity; and
   irradiating the second region of the resist film with energy radiation of a second intensity that is greater than the first intensity.

7. The method according to claim 1, wherein said irradiating comprises:
   irradiating the part of the first region and the second region of the mask film with a first radiation type; and
   irradiating the second region of the resist film, but not the first region of the resist film, with a second radiation type.

8. The method according to claim 7, wherein the first radiation type is an electron beam radiation, and the second radiation type is an ultraviolet (UV) light.

9. The method according to claim 1, wherein
   a hard mask film is between the light-shielding film and the resist film, and
   the method further comprises patterning the hard mask film using the mask pattern formed in the resist film.

10. The method according to claim 9, further comprising:
    patterning the halftone film using the patterned light-shielding film.

11. The method according to claim 10, further comprising:
    after the halftone film is patterned, removing a portion of the light-shielding film remaining on the patterned halftone film and any resist film remaining in the second region.

12. The method according to claim 10, wherein the hard mask film, the light-shielding film, and the halftone film under the second region of the resist film after patterning the halftone film are a mask frame of the photomask.

13. The method according to claim 1, wherein said removing the irradiated part of the first region of the resist film while leaving the non-irradiated part of the first region of the resist film and the irradiated second region of the resist film comprises:
    supplying a developer to the resist film to selectively dissolve the irradiated part of the first region of the resist film.

14. A method for manufacturing a semiconductor device, comprising:
    patterning a target film on a wafer using a photomask manufactured with the method according to claim 1.

* * * * *